(12) United States Patent
Hsieh et al.

(10) Patent No.: US 8,184,029 B1
(45) Date of Patent: May 22, 2012

(54) PHASE INTERPOLATOR

(75) Inventors: Cheng Hsiang Hsieh, Los Gatos, CA (US); Mengchi Liu, Fremont, CA (US)

(73) Assignee: Xilinx, Inc., San Jose, CA (US)

( * ) Notice: Subject to any disclaimer, the term of this patent is extended or adjusted under 35 U.S.C. 154(b) by 77 days.

(21) Appl. No.: 12/817,111

(22) Filed: Jun. 16, 2010

(51) Int. Cl.
*H03M 1/66* (2006.01)

(52) U.S. Cl. .......... 341/144; 327/231; 341/136

(58) Field of Classification Search .......... 341/135, 341/136, 144, 112; 327/266, 247, 246, 231
See application file for complete search history.

(56) References Cited

U.S. PATENT DOCUMENTS

| | | | | |
|---|---|---|---|---|
| 7,088,191 B2 * | 8/2006 | Paillet et al. | ............ | 331/57 |
| 7,135,903 B2 * | 11/2006 | Kizer et al. | ............ | 327/159 |
| 7,298,194 B2 * | 11/2007 | Pickering et al. | ............ | 327/231 |
| 7,423,469 B2 * | 9/2008 | Pickering et al. | ............ | 327/231 |
| 7,532,053 B2 * | 5/2009 | Rausch | ............ | 327/231 |
| 7,940,071 B2 * | 5/2011 | Sakai | ............ | 324/762.01 |
| 2010/0308880 A1 * | 12/2010 | Wang et al. | ............ | 327/163 |

OTHER PUBLICATIONS

Yuan et al., "A 10-bit 2GHz Current-Steering CMOS D/A Converter", Circuits and Systems, ISCAS 2007, IEEE International Symposium, May 27-30, 2007, pp. 737-740.

* cited by examiner

*Primary Examiner* — Peguy Jean Pierre
(74) *Attorney, Agent, or Firm* — W. Eric Webostad; Gerald Chan

(57) ABSTRACT

A phase interpolator is described. The phase interpolator can have a code-to-bias converter, and a phase interpolation interface. In an embodiment of a code-to-bias converter, a single digital-to-analog converter is provided to generate bias signaling associated with phase signals. A bleeder current source is provided to generate a bleeder current, where the bleeder current is selected responsive to phase so the phase signals do not reach zero current.

19 Claims, 7 Drawing Sheets

PHASE INTERPOLATOR

FIELD OF THE INVENTION

An embodiment of the invention relates to integrated circuit devices ("ICs"). More particularly, an embodiment of the invention relates to a phase interpolator for an IC.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

In current mode logic ("CML"), conventional multiplexing or phase selection used a separate dedicated digital-to-analog converter ("DAC") for each CML channel. Thus, for example, a four CML channel implementation used four independent DACs, namely one DAC for each CML channel.

Accordingly, it would be desirable and useful to use fewer dedicated DACs for handling more than one differential channel.

SUMMARY OF THE INVENTION

One or more embodiments generally relate to a phase interpolator.

An embodiment relates generally to a phase interpolation interface circuit. In such an embodiment, a first supply-coupled node and a second supply-coupled node are included. A first group of transistors has first source/drain nodes and second source/drain nodes, where the first source/drain nodes are coupled together at the first supply-coupled node. A second group of transistors has third source/drain nodes and fourth source/drain nodes, where the third source/drain nodes are coupled together at the second supply-coupled node. Each of the first group of transistors are coupled to a corresponding one of the second group of transistors at a corresponding second source/drain node and a corresponding fourth source/drain node to form a corresponding one of a plurality of transistor pairs. A current source network is coupled to ground and also to the second source/drain nodes of the first group of transistors and the fourth source/drain nodes of the second group of transistors, where the current source network includes a plurality of current sources associated with the plurality of transistor pairs for providing multiple channels.

Another embodiment relates generally to converter circuitry. In such an embodiment, a DAC is included. The DAC includes: a first matrix that is associated with a first portion of a phase range; a first row decoder that is coupled to the first matrix; a first column decoder that is coupled to the first matrix; a second matrix that is associated with a second portion of the phase range; a second row decoder that is coupled to the second matrix; and a second column decoder that is coupled to the second matrix. The first row decoder, the first column decoder, the second row decoder, and the second column decoder are coupled to receive a portion of a coded input.

Yet another embodiment generally relates to current source circuitry. In such an embodiment, a first current source, a second current source, and a bleeder current source are included. The first current source and the second current source each include: first transistors having first source/drain nodes coupled to a current drive source node; each of the first transistors having a gate coupled to receive a voltage bias; second transistors each having first source/drain nodes respectively coupled to second source/drain nodes of the first transistors; each of the second transistors having a gate coupled to receive a respective decoded input; second source/drain nodes of the second transistors coupled to a first source/drain node of a control transistor; a second source/drain node of the control transistor coupled to ground; and a gate of the control transistor coupled to receive a bias signal associated with a phase angle.

BRIEF DESCRIPTION OF THE DRAWINGS

Accompanying drawing(s) show exemplary embodiment(s) in accordance with one or more aspects of the invention; however, the accompanying drawing(s) should not be

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
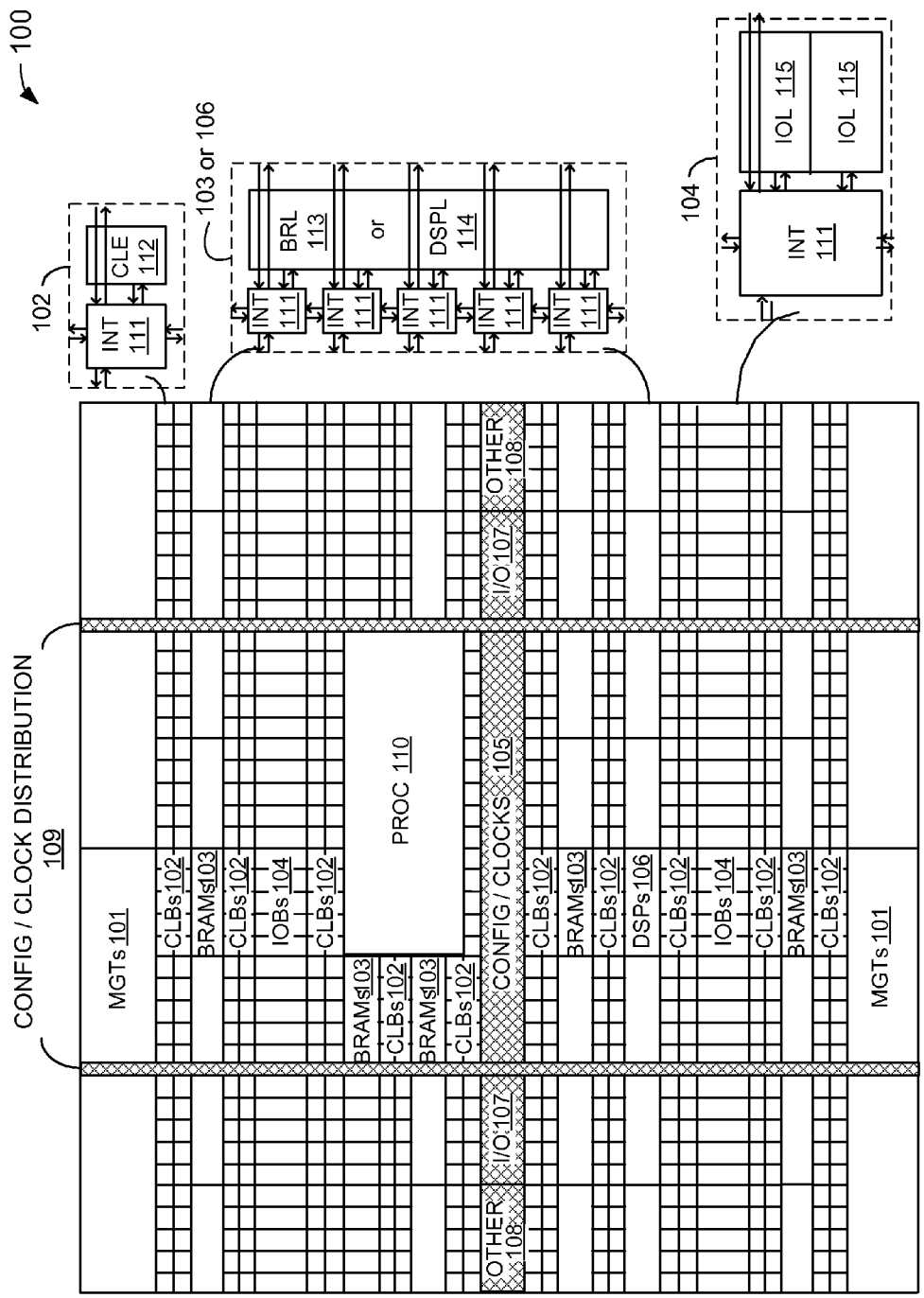
FIG. 1 is a simplified block diagram depicting an exemplary embodiment of a columnar Field Programmable Gate Array ("FPGA") architecture in which one or more aspects of the invention may be implemented.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a horizontal column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

In the following description a phase interpolator is described, which may be implemented in whole or in part using programmable logic of an FPGA. However, for purposes of clarity by way of example and not limitation, such phase interpolator is described as implemented with dedicated logic.

Figure 2:
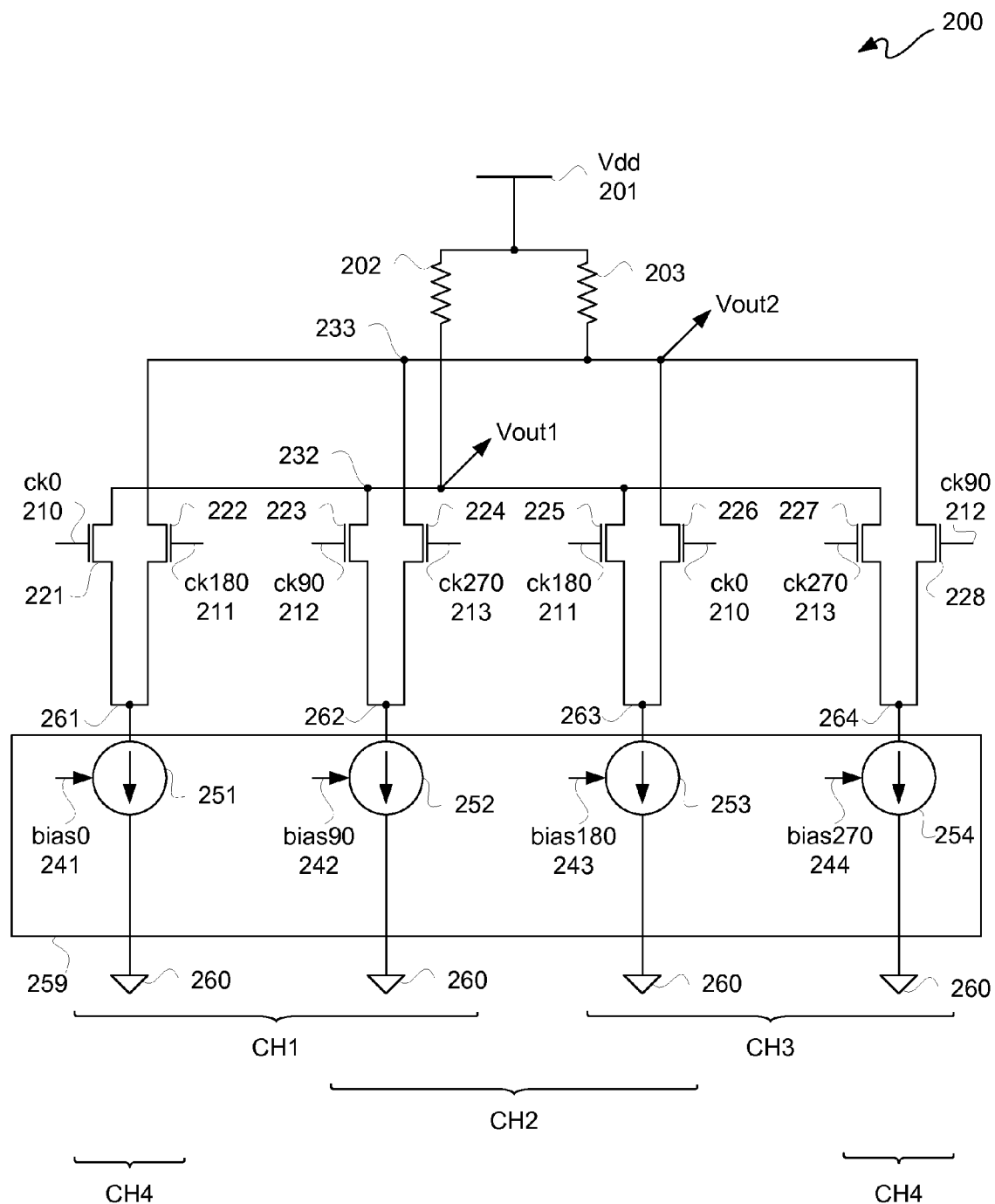
FIG. 2 is a circuit diagram depicting an exemplary embodiment of a phase interpolation interface of a phase interpolator.

FIG. 2 is a circuit diagram generally depicting an exemplary embodiment of a phase interpolation interface 200 of a phase interpolator. A supply voltage, such as Vdd 201, is connected to a first resistance, such as resistor 202, and a second resistance, such as resistor 203. Even though resistors 202 and 203 are illustratively depicted for resistive loads, it should be understood that transistors, such as PMOS transistors in the depicted embodiment, may be used to provide resistive loads.

For a CML channel implementation, resistors 202 and 203 may be for output resistances of an output CML buffer or driver, which for a CML implementation each of resistors may be at least approximately 50 ohms for example. However, even though the following example is described for a CML channel implementation, it should be understood that any differential channel may be used.

Resistor 202 couples Vdd 201 to a supply-coupled node, such as output node 232, and resistor 203 couples Vdd 201 to another supply-coupled node, such as output node 233. An output voltage, such as Vout1, may be sourced from output node 232, and an output voltage, such as Vout2, may be sourced from output node 233. The difference in these output voltages may be associated with a selected phase provided from phase interpolation interface 200.

Phase interpolation interface 200 effectively includes multiple CML output buffers, which may be coupled to a single DAC of a phase interpolator, as described below in additional detail. In this example, there are four differential channels, which are generally indicated as CH1, CH2, CH3, and CH4. However, it should be understood that 2, 3, 4, or more differential channels may be implement. In other words, at least two differential channels are implemented.

CH1 is for phase angle range 0 to 90 degrees, namely quadrant 1 of an x-y phase angle graph. CH2 is for phase angle range 90 to 180 degrees, namely quadrant 2. CH3 is for phase angle range 180 to 270 degrees, namely quadrant 3, and CH4 is for phase angle range 270 to 0 degrees, namely quadrant 4.

There are two groups of transistors. One group of transistors, namely transistors 221, 223, 225, and 227, is coupled to output node 232. The other group of transistors, namely transistors 222, 224, 226, and 228, is coupled to output node 233. More particularly, a first source/drain node of each of transistors 221, 223, 225, and 227 is coupled to output node 232, and a first source/drain node of each of transistors 222, 224, 226, and 228 is coupled to output node 233.

Transistors 221 through 228 are coupled in pairs at second source/drain nodes thereof as follows. Second source/drain nodes of transistors 221 and 222 are coupled to current source node 261. Second source/drain nodes of transistors 223 and 224 are coupled to current source node 262. Second source/drain nodes of transistors 225 and 226 are coupled to current source node 263. Second source/drain nodes of transistors 227 and 228 are coupled to current source node 264. In this exemplary embodiment, NMOS transistors are depicted for transistors 221 through 228, and thus first source/drain nodes thereof are drain nodes and second source/drain nodes thereof are source nodes. However, PMOS, or a combination of PMOS and NMOS, transistors may be implemented for transistors 221 through 228.

Gates of transistor 221, 223, 225, and 227 are respectively coupled to receive a set of phases of a clock signal. Moreover, gates of transistors 222, 224, 226, and 228 are respectively coupled to receive the set of phases of the clock signal.

A 0 degree phase signal, such as a 0 degree phase clock ("ck0") signal 210, is provided to a gate of transistor 221, and a 180 degree phase signal, such as a 180 degree phase clock ("ck180") signal 211, is provided to a gate of transistor 222. A 90 degree phase signal, such as a 90 degree phase clock ("ck90") signal 212, is provided to a gate of transistor 223, and a 270 degree phase signal, such as a 270 degree phase clock ("ck270") signal 213, is provided to a gate of transistor 224. A 180 degree phase signal, such as ck180 signal 211, is provided to a gate of transistor 225, and a 0 degree phase signal, such as ck0 signal 210, is provided to a gate of transistor 226. A 270 degree phase signal, such as ck270 signal 213, is provided to a gate of transistor 227, and a 90 degree phase signal, such as ck90 signal 212, is provided to a gate of transistor 228.

It should be understood that even though a set of phase signals of 0, 90, 180, and 270 degrees is described, with each phase range being generally 90 degrees, as described below in additional detail, starting and ending phases and/or phase ranges other than these may be implemented. It should further be understood that ck0 signal 210 and ck180 signal 211 is one complementary pair of clock signals, and ck90 signal 212 and ck270 signal 213 is another pair of complementary clock signals. Thus, if ck0 signal 210 is logic high for example, then ck180 signal 211 is logic low, and vice versa. Likewise, if ck90 signal 212 is logic high, then ck270 signal 213 is logic low, and vice versa.

Accordingly, if transistor 221 is in a substantially conductive state ("ON"), then transistor 222 is in a substantially nonconductive state ("OFF"), and vice versa. Likewise, if transistor 223 is ON, then transistor 224 is OFF, and vice versa. Furthermore, if transistor 225 is ON, then transistor 226 is OFF, and vice versa. Lastly, if transistor 227 is ON, then transistor 228 is OFF, and vice versa.

Pairs of transistors 221/222 and 225/226 are coupled to receive 0 and 180 degree phase clock signals. Moreover, pairs of transistors 223/224 and 227/228 are coupled to receive 90 and 270 degree phase clock signals. The application of clock signal phase for each pair grouping is flipped from left to right as associated with different output nodes.

A current source network 259 may be coupled between nodes 261 through 264 and ground 260. Current source network 259 may include current sources 251 through 254, which are described below in additional detail, for providing channels CH1 through CH4.

A current source 251 is coupled between current source node 261 and ground 260. A bias control ("bias") signal associated with a phase selection range, such as bias0 signal 241, is provided as an input to current source 251. A current source 252 is coupled between current source node 262 and ground 260. A bias signal associated with a phase selection range, such as bias90 signal 242, is provided as an input to current source 252. A current source 253 is coupled between current source node 263 and ground 260. A bias signal associated with a phase selection range, such as bias180 signal 243, is provided as an input to current source 253. A current source 254 is coupled between current source node 264 and ground 260. A bias signal associated with a phase selection range, such as bias270 signal 244, is provided as an input to current source 254.

In this exemplary embodiment, a phase selected to be between 0 and 90 degrees, namely in quadrant 1 of an x-y phase angle graph, means that bias0 signal 241 and bias90 signal 242 are asserted or maintained asserted for providing drive current and that bias180 signal 243 and bias270 signal 244 are de-asserted or maintained not asserted for providing bleeder current. In short, this is a selection operation, such as for multiplexing, as described below in additional detail. In this exemplary embodiment, a phase selected to be between 90 and 180 degrees, namely in quadrant 2 of an x-y phase angle graph, means that bias90 signal 242 and bias180 signal 243 are asserted or maintained asserted and that bias0 signal 241 and bias270 signal 244 are de-asserted or maintained not asserted. In this exemplary embodiment, a phase selected to be between 180 and 270 degrees, namely in quadrant 3 of an x-y phase angle graph, means that bias180 signal 243 and bias270 signal 244 are asserted or maintained asserted and that bias0 signal 241 and bias90 signal 242 are de-asserted or maintained not asserted. In this exemplary embodiment, a phase selected to be between 270 and 0 degrees, namely in quadrant 4 of an x-y phase angle graph, means that bias270 signal 244 and bias0 signal 241 are asserted or maintained asserted and that bias90 signal 242 and bias180 signal 243 are de-asserted or maintained not asserted. In this exemplary embodiment, each of the four phase ranges is semi-inclusive, namely inclusive of the starting phase angle of such range and not inclusive of the ending phase angle of the range, as follows: [0, 90), [90, 180), [180, 270), and [270, 0).

It should be understood that for high-speed serial operation, tail currents are to be responsive. Thus to enhance speed of operation, current sources of unselected channels are switched to a default bias but not off, as described below in additional detail.

Bias signals 241 through 244 may be generally understood to be used to control whether current sources 251 through 254, respectively, are used for drive current or bleeder current. Suppose for purposes of clarity by way of example and not limitation that a phase between 0 and 90 degrees is selected after a previous phase angle selection between 180 and 270 degrees. For this example, bias0 signal 241 and bias90 signal 242 may be thought of as used for providing drive current, and bias180 signal 243 and bias270 signal may be thought of as used for providing bleeder current, as described below in additional detail. Likewise, similar description is applicable to selection of any phase for any of the other quadrants, where bias signals associated with the range of a selected phase are asserted and where bias signals not associated with the range of the selected phase are not asserted.

It should be understood that "bleeder" tail currents are used by having non-zero default biases associated with unselected phases, and thus collectively there is a "bleed" current output shift or offset, such as illustratively depicted below as "bleed" current offset from zero current. The weight of bias signals in an unselected or standby state may vary from application-to-application, such as for example depending on how much standby or bleeder current may be tolerated, and how much delay in operation of current sources may be tolerated, among other factors. Thus, the amount of "bleed" current offset may vary from application-to-application. Bleed currents for some integrated circuit applications may generally be measured in microamperes.

Figure 3:
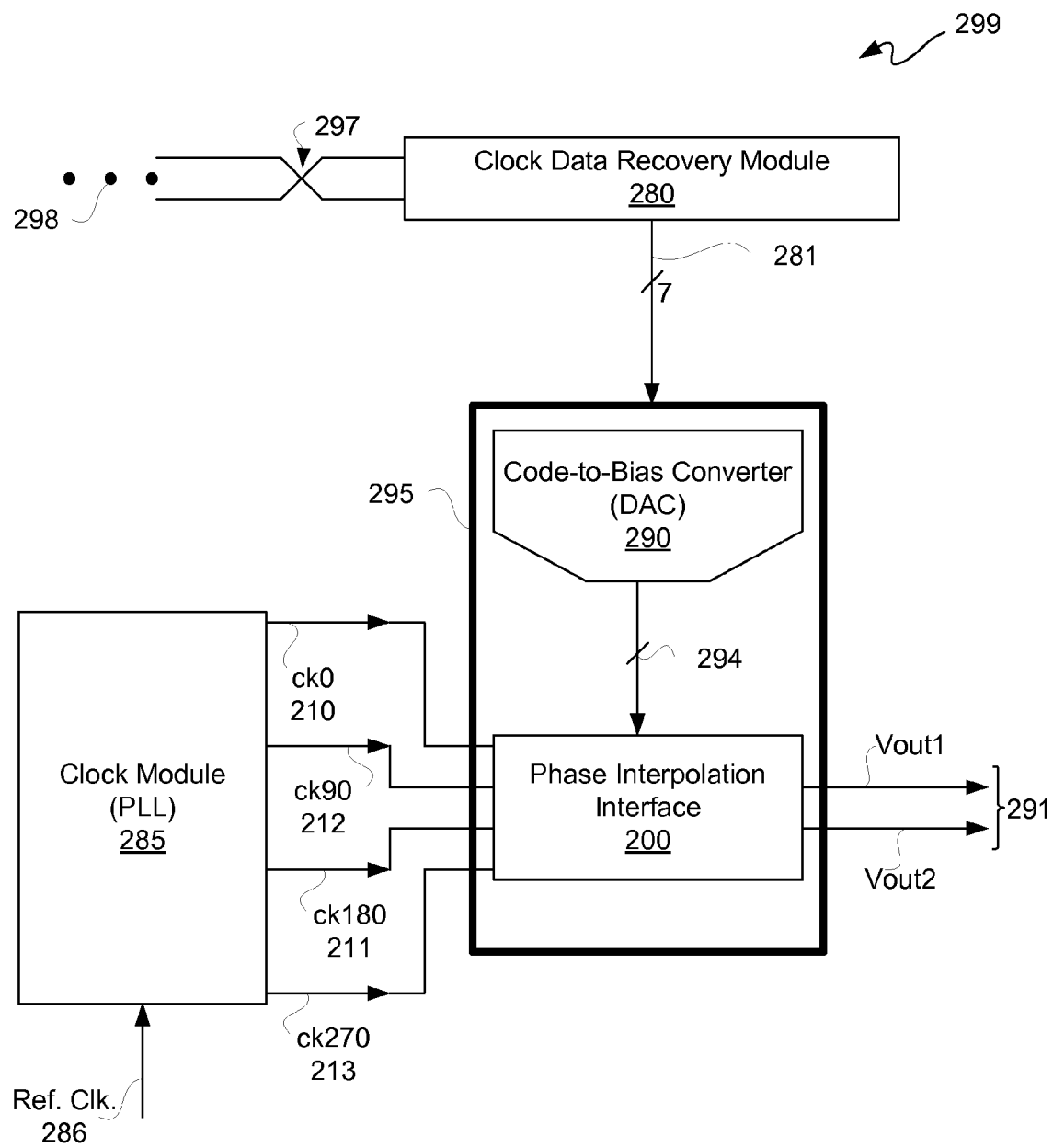
FIG. 3 is a block/circuit diagram depicting an exemplary embodiment of a differential data receiver front end.

FIG. 3 is a block/circuit diagram depicting an exemplary embodiment of a differential data receiver front end 299. Differential data receiver front end 299 includes clock data recovery module 280, phase interpolator 295, and clock module 285. With simultaneous reference to FIGS. 2 and 3, differential data receiver front end 299 is further described.

Clock module 285 may be implemented with a phase-lock-loop ("PLL"). PLL 285 receives a reference clock signal 286 and generates clock signals of different phases. In this exemplary embodiment, PLL 285 generates ck0 signal 210 at least generally at phase degree 0, ck90 signal 212 at least generally at phase degree 90, ck180 signal 211 at least generally at phase degree 180, and ck270 signal at least generally at phase degree 270. Clock signals 210 through 213 are input to phase interpolation interface 200 of phase interpolator 295, as previously described.

A stream of differential data 298 is provided as input to clock data recovery ("CDR") module 280. A conventional CDR module 280 may be implemented for producing a coded output, such as binary coded output 281. Optionally, CDR module 280 may be as described in a co-pending patent application entitled "Clock Data Recovery" by Cheng Hsiang Hsieh, et al., filed on Jun. 16, 2010, assigned application Ser. No. 12/817,126, which is incorporated by reference herein in its entirety for all purposes.

In this exemplary embodiment, a seven-bit binary code is used for binary coded output 281, namely for coding from 0 to 127 by increments of 1, to phase interpolator 295. However, it should be understood that other codes and/or other bit lengths may be used. In this exemplary embodiment, values 0 to 31 of such binary code are for phases from 0 to 90 degrees semi-inclusive (i.e., one side only as previously described); values 32 to 63 of such binary code are for phases from 90 to 180 degrees semi-inclusive; values 64 to 95 of such binary code are for phases from 180 to 270 degrees semi-inclusive; and values 96 to 127 of such binary code are for phases from 270 to 0 degrees semi-inclusive.

Code-to-bias converter 290 of phase interpolator 295 is coupled to receive binary coded output 281, as described below in additional detail, and is configured to produce bleeder or current drive signals 294 in response to such portion. Converter 290 may be implemented as a digital-to-analog converter ("DAC"). It should be understood that current drive signals 294 output from DAC 290 as described herein are generally analog, while other signals described herein are generally digital except for Vout1 and Vout2.

Current drive signals 294 are provided from DAC 290 to phase interpolation interface 200, as described below in additional detail. Optionally control circuitry as described herein is incorporated as part of DAC 290 and phase interpolation interface 200.

Figure 4:
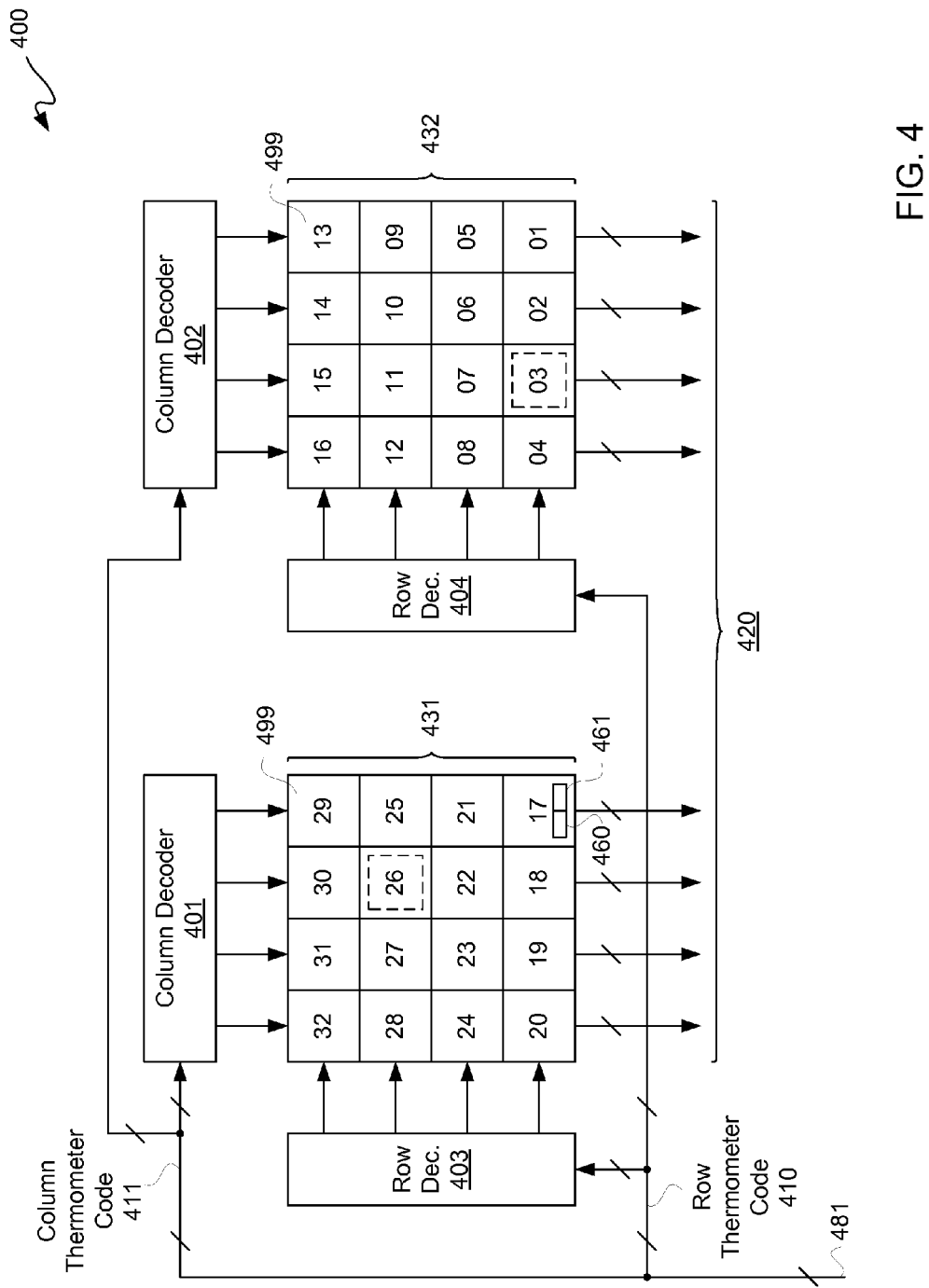
FIG. 4 is a block diagram depicting an exemplary embodiment of a bias cell matrix architecture of a thermometer-coded digital-to-analog converter ("DAC").

FIG. 4 is a block diagram depicting an exemplary embodiment of a bias cell matrix architecture of a thermometer-coded DAC 400. Column decoders 401 and 402 are coupled to receive column thermometer code input 411. Row decoders 403 and 404 are coupled to receive row thermometer code input 410. Even though thermometer code is illustratively depicted, it should be understood that any coding suitable for bias strength selection as described herein may be used. With simultaneous reference to FIGS. 2 through 4, DAC 400 is further described.

DAC 400 in this exemplary embodiment may be implemented as DAC 290. Thus, row and column thermometer code 410 and 411 may be sourced from binary coded output 281 and provided as code input 481. More particularly, at least the five (5) least significant bits ("LSBs") (e.g., 0:4) of binary coded output 281, with the most significant bit ("MSB") of the 5 LSBs set to 1, are provided to decoders 401 and 403 for selection of any of the values from 17 to 32 in bias cell matrix 431, and at least the five (5) LSBs (e.g., 0:4) of binary coded output 281, with the MSB of the 5 LSBs set to 0, are provided to decoders 402 and 404 for selection of any of the values from 1 to 16 in bias cell matrix 432. It should be understood that any of a variety of decoding implementations may be implemented other than the exemplary embodiment described.

Column decoder 401 is configured for decoding column thermometer code 411 and coupled to bias cell matrix 431 for selection of a column therefrom responsive to decoded column thermometer code. Column decoder 402 is configured for decoding column thermometer code 411 and coupled to bias cell matrix 432 for selection of a column therefrom responsive to decoded column thermometer code.

Row decoder 403 is configured for decoding row thermometer code 410 and coupled to bias cell matrix 431 for selection of a row therefrom responsive to decoded row thermometer code. Row decoder 404 is configured for decoding row thermometer code 410 and coupled to bias cell matrix 432 for selection of a row therefrom responsive to decoded row thermometer code.

For an operation, a cell out of one of the two current cell matrices is selected responsive to code input 481. Suppose for purposes of clarity by way of example and not limitation that after row and column decoding, cell 03 of bias cell matrix 432 is selected. Then a bias of strength 3 is output. It should be understood that thermocode, as the name implies, is linear. This facilitates monotonic operation. Thus, the amount of strength difference between any two sequentially adjacent values is the same as between any other two sequentially adjacent values. In this particular embodiment, values from current cell matrices indicate how many drive transistors are on. In this example, 03 means that the first three drive transistor of a current source are on, which is presumed to be an initial three drive transistors for purposes of clarity and not limitation.

Output from each bias cell matrix, such as bias cell matrices 431 and 432, is provided as a single multi-bit input to a current source. Thus, even if a cell from matrix 432 is selected, it should be understood that output 420 from DAC 400 is from both cell matrices 431 and 432. Thus, for example, if cell 26 was selected, signals on output lines associated with cells 01 through 26 would be asserted and voltage on output lines associated with cells 27 through 32 would not be asserted. Additionally, for example, if cell 03 was selected, signals on output lines associated with cells 01 through 03 would be asserted and voltage on output lines associated with cells 04 through 32 would not be asserted. Thus, it should be understood that matrices, such as bias cell matrices 431 and 432, are thermometer-coded over a linear sequence starting with one of such matrices and ending with the other of such matrices.

Each cell 499 of bias cell matrices 431 and 432 includes "shared" logic, e.g., generally shared OR, AND, and inverter ("OAI") logic, which may include these and/or other types of logic gates, and includes a latch, such OAI logic and latch are generally indicated as blocks 460 and 461 for an example cell 17 of cells 499. Generally, output of shared OAI 460 may be input to latch 461 for each of cells 499 for providing current signals 420, which may be current drive signals 294 of FIG. 3. Column and row decoders 401 through 404, in addition to selecting a cell 499, may be configured to provide decoded signals to indicate whether to select a first drive transistor set ("set A") or its inverse transistor set ("set B"), as described below in additional detail, for providing current signals 420.

Figure 5:
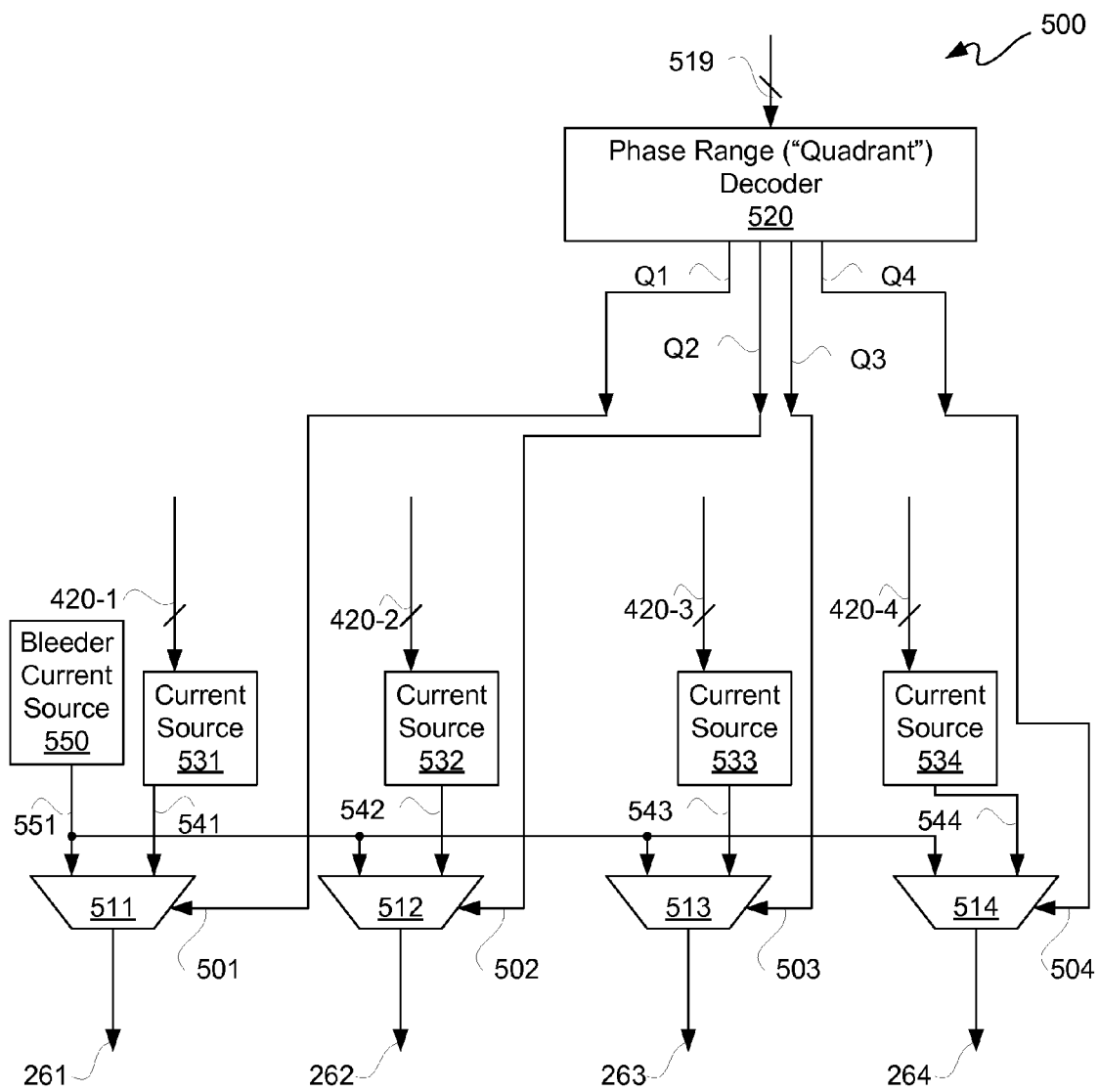
FIG. 5 is a block/circuit diagram depicting an exemplary embodiment of control circuitry of a phase interpolator of FIG. 3.

FIG. 5 is a block/circuit diagram depicting an exemplary embodiment of a current source network 500. Current source network 500 may be current source network 259 of FIG. 2. Current source network 500 may be implemented with bleeder current source 550, current sources 531 through 534, phase range decoder 520, and multiplexers 511 through 514. With simultaneous reference to FIGS. 2 through 5, current source network 500 is further described.

In this exemplary embodiment, quadrants are used for phase ranges, and thus phase range decoder 520 is a section or quadrant ("quadrant") decoder that provides quadrant signals indicating an active one of the quadrants at a time. Quadrant decoder 520 receives a portion of binary coded output 281. More particularly, in this exemplary embodiment, quadrant decoder 520 receives the two (2) most-significant-bits ("MSBs") of binary coded output 281 as quadrant input 519. However, in other implementations other bits for selecting other phase ranges may be used.

Continuing the above example of cell 03, suppose binary coded output 281 is 0000011, and thus generally the last two LSBs select 3 drive transistors. Additionally, MSBs 00, such as provided as quadrant input 519, indicate in which quadrant the phase angle is located, namely quadrant 1 in this example. In this exemplary embodiment, quadrant input 519 can be 00, 01, 10, or 11 for quadrants 1, 2, 3, and 4, respectively. Output from quadrant decoder are quadrant signals indicating which one of the four quadrants is currently selected. For convenience, these are indicated as signals Q1, Q2, Q3, and Q4 for quadrants 1 through 4, respectively.

Q1 through Q4 signals are provided to multiplexers 511 through 514, respectively, as control select signals 501 through 504, respectively. Control select signals 501 through 504 are provided to pass gates. For purposes of clarity by way of example and not limitation, pass gates are illustratively represented as multiplexers 511 through 514; however, any circuitry suitable for selecting as described herein may be used.

Each of multiplexers 511 through 514 is provided with a bleeder current voltage ("bleeder voltage") signal 551 as an input sourced from bleeder current source 550. Bleeder voltage signal 551 is for providing an output for paths with unselected current sources. Thus, continuing the above example of a phase angle of 30, quadrant 1 would be used, and thus control select signals 501 and 502 would be asserted. Control select signals 503 and 504 would be in an unasserted condition, and in such condition multiplexers 503 and 504 select bleeder voltage signal 551 for output, respectively.

Multiplexers 511 through 514 are provided with current-related voltage signals 541 through 544, respectively, as inputs. Two of these current-related voltage signals are passed by multiplexers 511 through 514 during an operational cycle. The other two of these current signals of signals 541 through 544 are not passed by multiplexers 511 through 514 during an operational cycle, but rather multiplexers associated therewith pass bleeder current via bleeder voltage signal 551.

Outputs 420-1 through 420-4 may be respectively sourced from output 420. In this embodiment, two selected outputs of outputs 420-1 through 420-4 are used to provide respective bias strengths for analog current strengths, as described below in additional detail. Current-to-voltage conversion is performed to provide output voltage signals 541 through 544. Output voltages selected by multiplexers 511 through 514 may respectively be provided to nodes 261 through 264, and thus for clarity are referenced as voltage signals 261 through 264.

Figure 6:
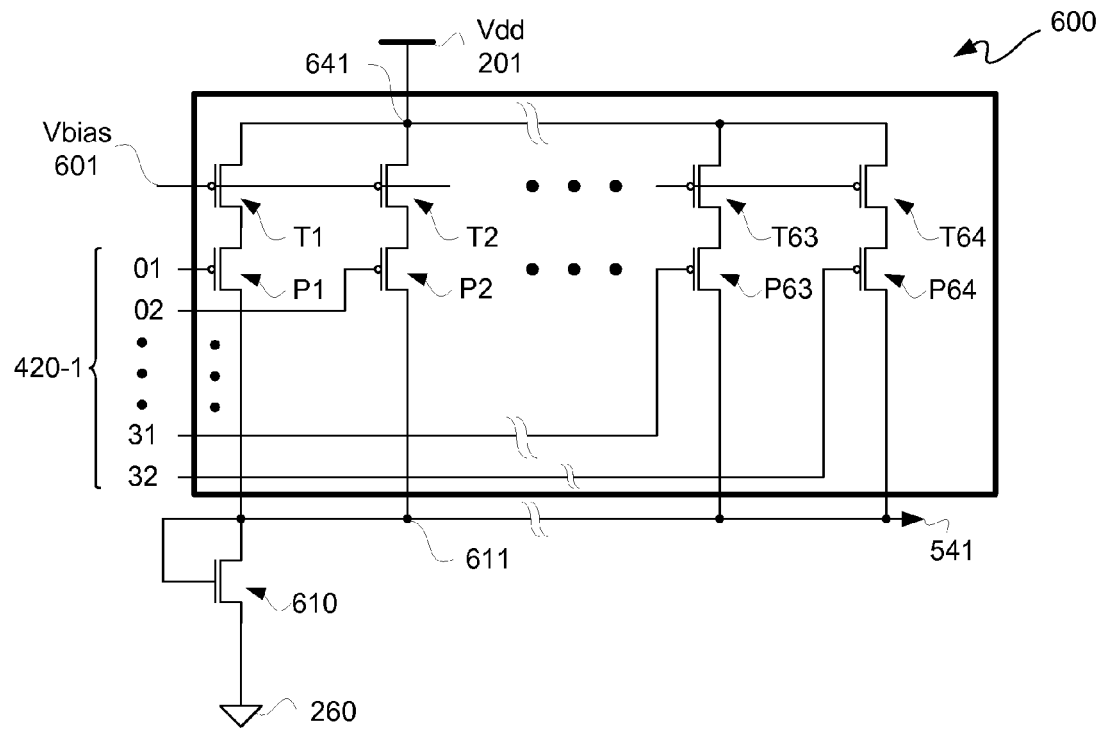
FIG. 6 is a circuit diagram depicting an exemplary embodiment of a current source for generation of a linear waveform.

FIG. 6 is a circuit diagram depicting an exemplary embodiment of a current source 600. Current source 600 may be current source 531 of FIG. 5 for example. For clarity, only one current source 600 is illustratively depicted, as the other current sources 532 through 534 of FIG. 5 will be understood from this example.

Current source 600 includes T1 through T64 PMOS transistors, P1 through P64 PMOS transistors, and NMOS transistor 610. Though specific examples of NMOS and PMOS transistors are illustratively depicted, it should be understood that other combinations of either or both NMOS and PMOS transistors may be used.

Bias strength output 420-1, which may be sourced from output 420 of FIG. 4, in this exemplary embodiment is 32 signal inputs wide respectively provided to gates of transistors P1 through P64. Accordingly, bias strength output 420-1 is active low. Continuing the above example of cell 03 being selected, then 01 through 03 inputs of bias strength output 420-1 would be logic low and 04 though 32 inputs of bias strength output 420-1 would be logic high. As previously described with reference to FIG. 4, there are two sets of drive transistor pairs in each current source, namely set A and set B. In this exemplary embodiment, set A is transistors T1 through T32 and P1 through P32, and set B is transistors T33 through T64 and P33 through P64. Select circuitry for selecting either set A or set B is not shown for purposes of clarity. Quadrants 1 and 3 use set A, and quadrants 2 and 4 use set B.

A source/drain node of each of P1 through P64 transistors is coupled to voltage output node 611, and voltage output node 611 is from where output voltage 541 is sourced. Another source/drain node of each of P1 through P64 transistors is respectively coupled to a source/drain node of each of T1 through T64 transistors. The other source/drain node of T1 through T64 transistors is coupled to node 641. Node 641 may be coupled to a supply voltage, such as Vdd 201 for example.

Current-to-voltage conversion transistor 610 has a source/drain node coupled to node 611 and to a gate thereof, and another source drain node coupled to ground 260. In other words, conversion transistor 610 is a diode connected transistor where effectively the magnitude of current passed thereto is converted to an analog voltage. Thus, each active transistor of transistors of set A or set B is coupled to ground 260 through a channel of transistor 610.

Each of T1 through T64 transistors is gated with a Vbias signal 601. Vbias signal 601 may be a reference voltage bias signal for placing each of T1 through T64 transistors in an ON state or a saturation state when active, namely when electrically coupled to node 641. Vbias signal 601 may be provided from a reference voltage source with a reference transistor. Such reference transistor may be sized the same as each of transistors T1 through T64. Optionally, transistors T1 through T64 may be sized to be larger than the reference transistor for example. Thus, while transistors T1 through T64 may all be designed to be generally the same size, they may or may not be the same size as a reference transistor used to provide Vbias signal 601. In this embodiment, Vbias signal 601 is a positive voltage greater than zero volts that places transistors T1 through T64 in a saturation or partially-conductive state.

Thus, it should be understood that the amount of drive current provided to output node 611 for providing voltage signal 541 of FIG. 5 for example may be directly proportional to the number of P1 through P32 transistors in an ON state. Thus, from a DAC 400 decoded input, each gate of pass gated transistors, such as transistors P1 through P32, of selected current sources, such as for example current sources 531 and 532 for a phase angle in quadrant 1, may be set.

Current from active current sources may effectively be combined at an output node, such as output node 232 for this example of quadrant 1, to set magnitude of such output. Thus, an output waveform associated with decoded input as it relates to phase versus current magnitude may be generated, as described below in additional detail.

Drive current may be a stepped analog representation of a linear drive current, where the steps are generally uniform in current magnitude up or down. In this embodiment, it should be understood that channel width ("W") and channel length ("L") of each of transistors T1 through T64 is generally manufactured to be the same. Thus, a linear wave or waveform, namely a triangle or triangle-like wave, may be produced as described below in additional detail. Such a waveform may effectively have line segments with positive slopes, namely inclines, and line segments with negative slopes, namely declines, by using output of more than one current source. Such a waveform may be symmetric or asymmetric.

Figure 7:
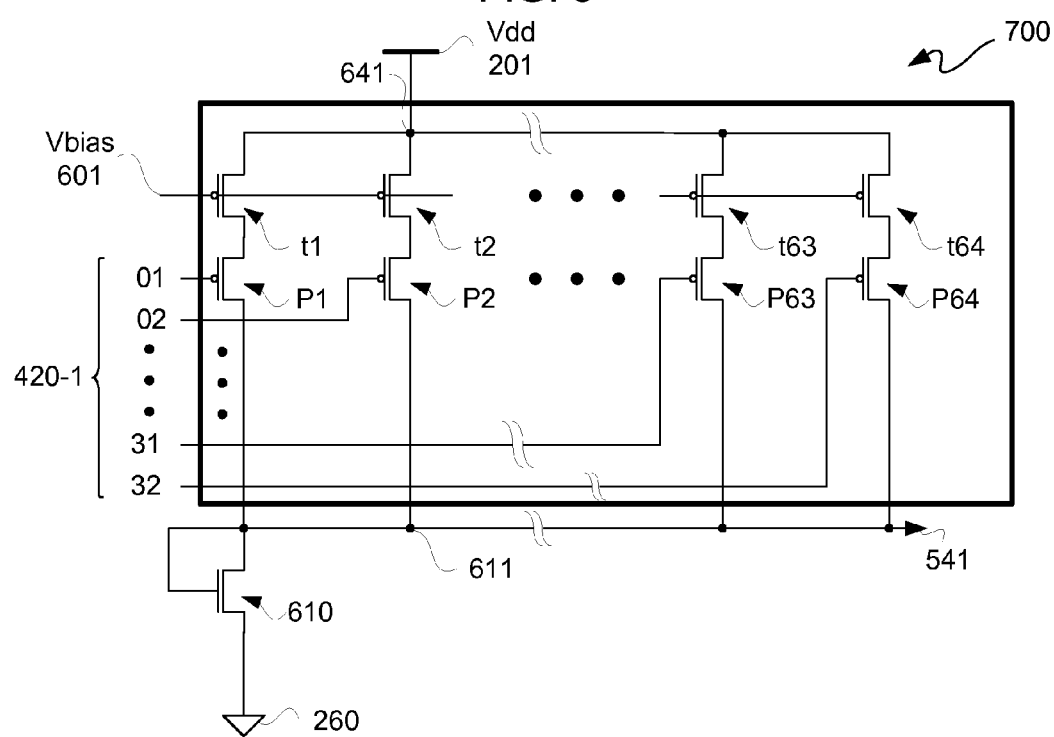
FIG. 7 is a circuit diagram depicting an exemplary embodiment of a current source for generation of a non-linear waveform.

FIG. 7 is a circuit diagram depicting an exemplary embodiment of a current source 700. Current source 700 may be current source 531 of FIG. 5 for example. For clarity, only one current source 700 is illustratively depicted, as the other current sources 532 through 534 of FIG. 5 will be understood from this example. Current source 700 is further described with simultaneous reference to FIGS. 2 through 6.

It should be understood that current sources 531 through 534 may be coupled to receive respective bias strength signals 420-1 through 420-4, which for the exemplary embodiment only two of such current sources may be active at a time. It should further be understood that bias strength signals 420-1 through 420-4 may all be driven from output 420 of a single DAC for supporting multiple channels, such as for example four channels in the depicted embodiment. However, fewer or more channels may be implemented as may vary from implementation-to-implementation.

Current source 700 includes t1 through t34 PMOS transistors, P1 through P64 PMOS transistors, and NMOS transistor 610. Though specific examples of NMOS and PMOS transistors are illustratively depicted, it should be understood that other combinations of either or both NMOS and PMOS transistors may be used.

With respect to circuitry, other than respectively replacing each of T1 through T64 transistors with t1 through t64 transistors, current source 700 is the same as current source 600 of FIG. 6. Transistors t1 through t64 differ from transistors T1 through T64 transistors as there is intentional channel dimensional variability in the manufacture of transistors T1 through T32. Thus, for example, if T1 transistor has a channel width W1 and channel length L1, and T2 transistor has a channel width W2 and channel length L2, then W1 may be substantially different from W2 even though L1 equals L2. Thus, channel widths of transistors t1 through t64 may be intentionally varied by design in order to pass differing amounts of current from one another when active. Other combinations of different channel dimensions may be used for purposes as described herein.

With such variability by design of transistors t1 through t64, it should be understood that the incremental increase in current drive sourced at node 611 may not be linear. In other words, it should be understood that the amount of drive current provided to output node 611 for providing voltage signal 541 of FIG. 5 for example may be directly proportional to the number of P1 through P32, or P33 through P64, transistors in an ON state and may be a stepped analog representation of a nonlinear drive current, namely where the steps are not generally uniform in current magnitude up or down. Thus, at least one channel dimension of transistors t1 through t64 may be varied to produce a nonlinear wave, as described below in additional detail. Such nonlinear wave or waveform may have curved contours. Furthermore, such nonlinear waveform may be symmetric or asymmetric.

Figure 8:
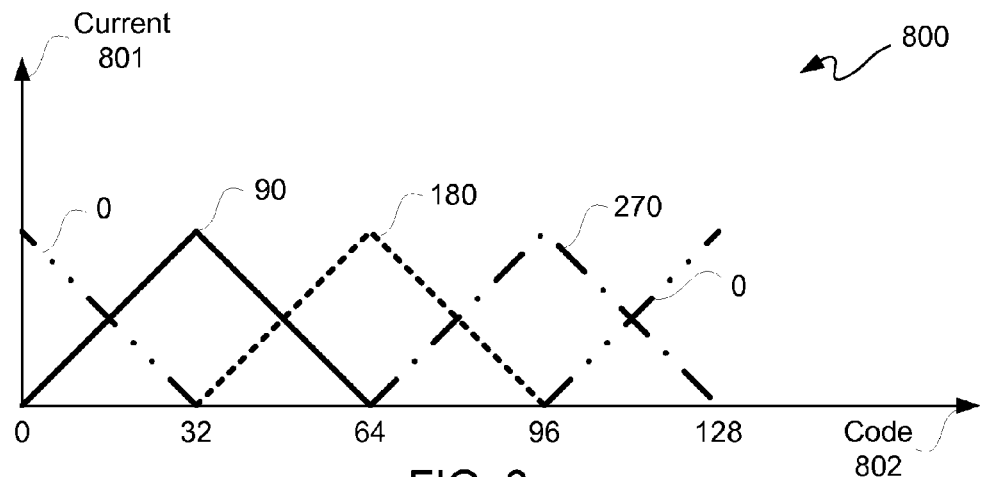
FIG. 8 is a phase signal diagram depicting an exemplary embodiment of conventional phase signaling.

FIG. 8 is a phase signal diagram depicting an exemplary embodiment of conventional phase signaling 800. In conventional phase signaling, there may be a 0 degree phase signal (dashed-line with two dots), a 90 degree phase signal (solid line), a 180 degree phase signal (dotted line), and a 270 degree phase signal (dashed-line with single dots). These four phase signals conventionally were respectively driven by four separate conventional DACs to have sufficient turn-on time. Moreover, these four phase signals are all linear waves, namely triangle waves.

Figure 9:
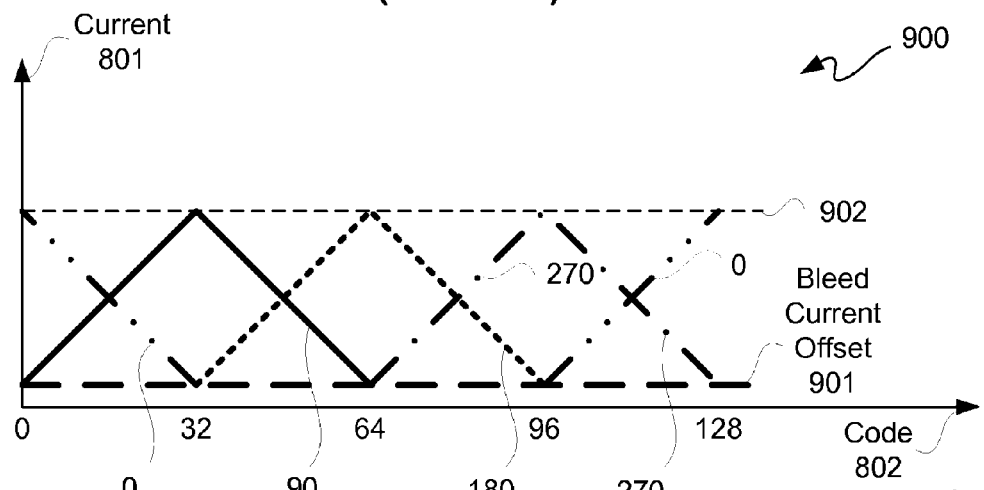
FIG. 9 is a phase signal diagram depicting an exemplary embodiment of phase signaling generated with the current source of FIG. 6.

FIG. 9 is a phase signal diagram depicting an exemplary embodiment of phase signaling 900. Like conventional phase signaling, there may be a 0 degree phase signal (dashed-line with two dots), a 90 degree phase signal (solid line), a 180 degree phase signal (dotted line), and a 270 degree phase signal (dashed-line with single dots). However, these four phase signals are driven by a single DAC, such as DAC 290 or 400 resulting is reduced complexity and cost.

A single DAC may be used with sufficient turn-on time, because bleeder current is injected to avoid turn-on delay. Thus, in contrast to conventional phase signaling, phase signals of FIG. 9 do not go to zero current, but rather are offset from zero current by bleed current offset 901, such as may be sourced from bleeder current source 550 of FIG. 5. It should be understood that current sources 531 through 534 may be implemented as described with reference to current source 600 of FIG. 6 for producing linear waves, such as triangle waves depicted with reference to phase signaling 900. It should further be understood that total current 902 is generally constant. Total current 902 is produced by adding absolute value of magnitudes of outputs of two current sources in the depicted exemplary embodiment as represent by two phase waves within a coded range, such as a quadrant. Total current 902 is somewhat greater than conventional total current due to bleed current offset 901.

Figure 10:
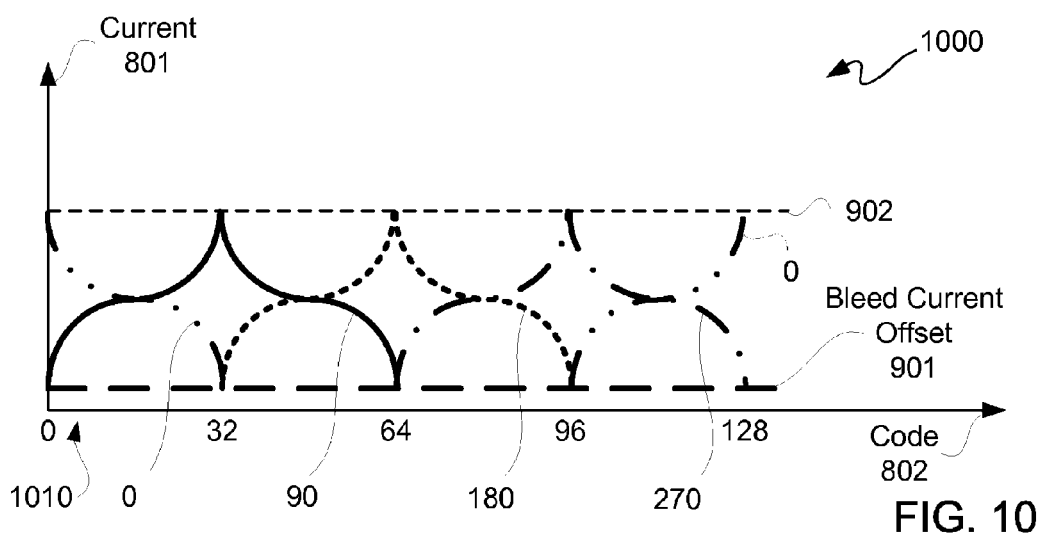
FIG. 10 is a phase signal diagram depicting an exemplary embodiment of phase signaling generated with the current source of FIG. 7.

FIG. 10 is a phase signal diagram depicting an exemplary embodiment of phase signaling 1000. In phase signaling 1000, there is a 0 degree phase signal (dashed-line with two dots), a 90 degree phase signal (solid line), a 180 degree phase signal (dotted line), and a 270 degree phase signal (dashed-line with single dots). These four phase signals are driven by a single DAC, such as DAC 290 or 400 resulting is reduced complexity and cost. A single DAC is used with sufficient turn-on time, because bleeder current is injected to avoid turn-on delay. Thus, in contrast to conventional phase signaling, phase signals of FIG. 10 do not go to zero current, but rather are offset from zero current by bleed current offset 901, such as may be sourced from bleeder current source 550 of FIG. 5. It should be understood that current sources 531 through 534 may be implemented as described with reference to current source 700 of FIG. 7 for producing nonlinear waves, such as waves with curved contours. For example, sine waves or distorted sine waves with convex and concave contours as depicted with reference to phase signaling 900 may be generated. Total current 902, however, is the same as between FIGS. 9 and 10.

It should be understood that a linear code implementation as described herein may be used to produce linear waves. However, linear waves may not result in linear phase shifts. By sizing drive transistors, such as transistors t1 through t64 for example, of a current source so as to produce nonlinear waves, nonlinearity in phase shifting may be compensated for by using such nonlinear waves. In other words, by combining phase information generated by two separate current sources, each of which is configured to generate nonlinear waves, results from such combination may be used to provide at least generally linear phase shifts.

With simultaneous reference to FIGS. 2 through 10, recall from the above example, binary coded output 281 is for 0 to 127, which is broken down into four sets of 32 increments each. These 32 increments are represented in matrices 431 and 432. These increments may be used to break down a phase range, such as from 0 to 89 degrees for example, into 32 equal phase increments. As the total current for any two selected current sources is the same, as described herein, by having the bias strength for a selected bias signal, strength of the other bias signal is determinable. For example, if the total bias to produce a total current is normalized to 1, then by subtracting the matrix selected bias from 1 would yield the other bias. Hence, there are two sets of drive transistors in a current source, namely set A and set B.

It should be understood that bias cell matrices 431 and 432 represents bias strengths that may be depicted as being along an x-axis, which is code axis 802. Along a y-axis, namely current axis 801, relative current strength output from current sources for phases may be depicted. Within a section of code representing a quadrant, two phase waves may be active as associated with two current sources and two current sources may be inactive as represented by bleeder current offset 901.

For purposes of clarity by way of example and not limitation, suppose a selected phase angle responsive to binary code input 281 is 15 degrees. In such condition, bias0 signal 241 and bias90 signal 242 would be active or asserted, and bias180 signal 243 and bias270 signal 244 would not be asserted in favor of bleed currents 551. However, output 420-1 associated with bias0 signal 241 may be for a stronger bias than bias90 signal 242 as 15 degrees is closer to 0 degrees than 90 degrees. For example, in FIG. 10, an indication 1010 of about where 15 degrees may be is provided. Magnitude of a phase 0 signal is greater than magnitude of a phase 90 signal at such location, and magnitude of such phase 90 signal at such location is equal to total current 902 less magnitude of such phase 0 signal at such location. Accordingly, shared OAI logic 501 may be configured to produce both output 420-1 and 420-2 from a single DAC output 420 where two sets, namely set A and set B, of drive transistor are used.

For voltage signals 541-544 or bleeder source 552 passed to nodes 261-264, respectively, these signals may contend or add to manifest a voltage on Vout1 and Vout2. In this embodiment, when a phase between 0 and 90 degrees is selected, ck0 signal 210 and ck90 signal 212 are logic high, and ck180 signal 211 and ck270 signal 213 are logic low. Accordingly, transistors 222, 224, 225, and 227 are OFF, and transistors 221, 223, 226, 228 are ON for conducting current for this part of a clock cycle. Furthermore, bias0 and bias90 signals, which may be thought of as control select signals 501 and 502, respectively, would be asserted, and bias180 and bias270 signals, which may be thought of as control select signals 503 and 504, respectively, would not be asserted for this phase angle range example. The differential output of Vout1 and Vout2, namely the difference in voltages at nodes 232 and 233, indicates a selected phase.

If the above example were for a phase angle selected in quadrant 2, namely from 90 to 180 degrees semi-inclusive, then ck90 and ck180 signals would be logic high and ck0 and ck270 signals would be logic low in this embodiment for this part of a clock cycle. Furthermore, bias90 and bias180 signals would be asserted, and bias0 and bias270 signals would not be asserted.

If the above example were for a phase angle selected in quadrant 3, namely from 180 to 270 degrees semi-inclusive, then ck180 and ck270 signals would be logic high and ck0 and ck90 signals would be logic low in this embodiment for this part of a clock cycle. Furthermore, bias180 and bias270 signals would be asserted, and bias0 and bias90 signals would not be asserted.

Lastly, if the above example were for a phase angle selected in quadrant 4, namely from 270 to 0 degrees semi-inclusive, then ck270 and ck0 signals would be logic high and ck90 and ck180 signals would be logic low in this embodiment for this part of a clock cycle. Furthermore, bias270 and bias0 signals would be asserted, and bias90 and bias180 signals would not be asserted.

Accordingly, it should be understood that differential data receiver front end 299 does not technically recover a clock signal from data stream 298. Rather, differential data receiver front end 299 has its own clock signal, which is sourced from reference clock signal 286. However, differential data receiver front end 299 is capable of moving phase of its clock signal to at least approximately a center or data crossing 297 of data stream 298, or other targeted location of such data stream 298. Thus, what is recovered is a phase or phase relationship between data and a clock signal of differential data receiver front end 299. This phase shifting or movement may be: nonlinear if linear phase signals are used; or linear if nonlinear phase signals are used.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A phase interpolation interface circuit, comprising:
a first supply-coupled node;
a second supply-coupled node;
a first group of transistors having first source/drain nodes and second source/drain nodes, wherein the first source/drain nodes are coupled together at the first supply-coupled node;
a second group of transistors having third source/drain nodes and fourth source/drain nodes, wherein the third source/drain nodes are coupled together at the second supply-coupled node;
wherein each of the first group of transistors are coupled to a corresponding one of the second group of transistors at a corresponding second source/drain node and a corresponding fourth source/drain node to form a corresponding one of a plurality of transistor pairs;
a current source network coupled to ground and also to the second source/drain nodes of the first group of transistors and the fourth source/drain nodes of the second group of transistors; and
wherein the current source network includes a plurality of current sources associated with the plurality of transistor pairs for providing multiple channels; and
wherein at least two of the current sources are coupled to receive respective bias strength signals that are provided by a single digital-to-analog converter ("DAC").

2. The circuit according to claim 1, wherein:
gates of the first group of transistors are respectively coupled to receive a set of phases of a clock signal; and
gates of the second group of transistors are respectively coupled to receive the set of phases of the clock signal.

3. The circuit according to claim 2, wherein:
a first portion of the plurality of transistor pairs are gated to receive first phases from the set of phases of the clock signal;
a second portion of the plurality of transistor pairs are gated to receive second phases from the set of phases of the clock signal;
the first phases are different from the second phases;
the first phases include opposite angles from one another; and
the second phases include opposite angles from one another.

4. The circuit according to claim 3, wherein:
the set of phases includes 0, 90, 180 and 270 degrees;
the first phases are 0 and 180 degrees; and
the second phases are 90 and 270 degrees.

5. The circuit according to claim 2, wherein:
the current source network further includes a bleeder current source and select circuitry;
the select circuitry is coupled to receive output from the bleeder current source and the current sources for selectively passing a bleeder signal associated with unselected ones of the current sources and a respective drive signal from selected ones of the current sources.

6. The circuit according to claim 5, wherein:
the bleeder current signal is provided to each of a plurality of select circuits of the select circuitry; and
drive current signals respectively from the current sources are respectively provided to the select circuits.

7. A converter circuitry, comprising:
a digital-to-analog converter including:
a first matrix that is associated with a first portion of a phase range;
a first row decoder that is coupled to the first matrix;
a first column decoder that is coupled to the first matrix;
a second matrix that is associated with a second portion of the phase range;
a second row decoder that is coupled to the second matrix;
a second column decoder that is coupled to the second matrix; and
wherein the first row decoder, the first column decoder, the second row decoder, and the second column decoder are coupled to receive a first portion of a coded input.

8. The converter circuitry according to claim 7, wherein output from the first matrix and the second matrix responsive to the first portion of the coded input provides a bias strength output for a current source.

9. The converter circuitry according to claim 7, wherein the first matrix and the second matrix are thermometer-coded over a linear sequence starting from the first matrix and ending with the second matrix.

10. The converter circuitry according to claim 7, wherein the coded input is divided into sections respectively associated with phase ranges.

11. The converter circuitry according to claim 10, wherein:
the phase ranges associated with the sections include 0 to 90 degrees, 90 to 180 degrees, 180 to 270 degrees, and 270 to 0 degrees; and
each of the phase ranges is semi-inclusive with respect to starting and ending points.

12. The converter circuitry according to claim 10, further comprising:
a phase range decoder coupled to receive a second portion of the coded input; and
the phase range decoder configured to provide section signals indicating one of the sections at a time.

13. A current source circuitry, comprising:
a single digital-to-analog converter to generate bias signaling associated with phase signals;
a first current source;
a second current source;
a bleeder current source to generate a bleeder current; and
wherein the bleeder current is selected responsive to phase so the phase signals do not reach zero current.

14. The current source circuitry according to claim 13, wherein:
the single digital-to-analog converter generates current bias signals as the bias signaling associated with the phase signals;
the first current source and the second current source are coupled to receive respective versions of the current bias signals to generate a first voltage and a second voltage respectively associated therewith; and
wherein the bleeder current is converted to a bleeder voltage for providing a differential output with a combination of the first voltage and the second voltage.

15. The current source circuitry according to claim 14, wherein the first current source and the second current source each include:
first transistors having first source/drain nodes coupled to a voltage supply node;
each of the first transistors having a gate coupled to receive a voltage bias;
second transistors each having first source/drain nodes respectively coupled to second source/drain nodes of the first transistors;
the second transistors having gates respectively coupled to receive the current bias signals;

second source/drain nodes of the second transistors coupled to one another at a voltage output node and at a current-to-voltage converter; and the current-to-voltage converter coupled to ground.

16. The current source circuitry according to claim 15, wherein the first transistors have generally the same channel dimensions for defining a triangular or triangular-like waveform.

17. The current source circuitry according to claim 15, wherein the first transistors have different channel dimensions for defining a waveform with curved contours.

18. The current source circuitry according to claim 17, wherein the waveform is asymmetric.

19. The current source circuitry according to claim 15, wherein the current-to-voltage converter is a transistor with a source node coupled to the ground, a drain node coupled to the voltage output node, and a gate connected to the drain node.

* * * * *